United States Patent [19]

Koshiba et al.

[11] Patent Number: 4,886,565

[45] Date of Patent: Dec. 12, 1989

[54] REACTIVE ION ETCHING APPARATUS

[75] Inventors: Mitsunobu Koshiba; Keiichi Yamada; Yoshiyuki Harita; Shin'ichi Kawamura; Yuuji Furuto, all of Kanagawa, Japan

[73] Assignee: Japan Synthetic Rubber Co., Ltd., Tokyo, Japan

[21] Appl. No.: 307,280

[22] Filed: Feb. 7, 1989

[30] Foreign Application Priority Data

Feb. 10, 1988 [JP] Japan .................................. 63-27657
Nov. 21, 1988 [JP] Japan ................................. 63-292518

[51] Int. Cl.$^4$ ..................... B44C 1/22; H01L 21/306; C03C 25/06; B29C 37/00
[52] U.S. Cl. ................................. 156/345; 156/643; 156/646; 204/298
[58] Field of Search ....................... 156/345, 643, 646; 204/192.32, 192.35, 192.37, 298 EE, 298 MM, 298 CM, 298 EP; 427/38, 39; 118/724, 728, 50.1, 620, 623

[56] References Cited

U.S. PATENT DOCUMENTS

| 4,422,896 | 12/1983 | Class et al. | 156/643 |
| 4,492,610 | 1/1985 | Okano et al. | 156/643 |
| 4,565,601 | 1/1986 | Kakehi et al. | 156/643 |
| 4,572,759 | 2/1986 | Benzing | 204/298 X |
| 4,581,118 | 4/1986 | Class et al. | 204/298 |
| 4,771,730 | 9/1988 | Tezuka et al. | 118/723 |

FOREIGN PATENT DOCUMENTS 58-170016 10/1983 Japan .
59-40375 8/1984 Japan .
61-107346 5/1986 Japan .

Primary Examiner—William A. Powell
Attorney, Agent, or Firm—Oliff & Berridge

[57] ABSTRACT

A reactive ion etching apparatus used in the manufacturing process of semiconductor elements such as ICs and LSIs is herein disclosed. The material to be etched is supported by a chucking device disposed on a negative electrode and in this apparatus, a magnetic field parallel to the surface of the material to be etched is generated. The reactive ion etching is carried out while cooling the negative electrode to a temperature of not more than 0° C.

10 Claims, 8 Drawing Sheets

REACTIVE ION ETCHING APPARATUS

BACKGROUND OF THE INVENTION

1. Field of the Invention

The present invention relates to an apparatus for etching, which is used in the manufacturing processes of semiconductor elements such as ICs and LSIs and more particularly to a reactive ion etching apparatus.

2. Description of the Prior Art

Heretofore, in the method for manufacturing semiconductor elements such as ICs and LSIs, there has been adopted a photolithography technique for forming patterns which comprises the steps of applying, onto the surface of a substrate to be processed, a radiation-sensitive resin such as a negative-working photoresist composed of a cyclized substance of polyisoprene and a bisazide or a positive-working photoresist composed of a novolak resin and a quinonediazide compound, exposing the radiation-sensitive layer to g-line (wave length: 436 nm) or i-line (wave length: 365 nm) of a mercury lamp and developing the radiation-sensitive layer with a developer to form a desired pattern.

In this connection, LSIs have been made finer recently and thus the minimum dimension of patterns to be formed on a substrate has been decreased to submicron region. In the formation of patterns having such a fine dimension, a problem that sufficient resolution cannot be attained arises due to the influence of reflection of light during the exposure, shallow focal depth of the exposure system used, if a conventional photolithography technique is employed in which a developer is used to develop patterns, in particular in the case where a topographic substrate having step structure is used.

As a means for solving such a problem, there has been proposed a dry developing process which comprises etching a resist layer applied to a substrate to form a desired resist pattern utilizing a reactive ion etching apparatus for generating gas plasma such as oxygen gas plasma in place of developing the resist layer with a developer to obtain a desired pattern as in the photolithography method explained above (see Laid-open Japanese Patent Application Publication (hereinafter referred to as "J.P. KOKAI") No. 61-107346 or the corresponding European Laid-Open Patent Application No. 184,567).

As such a reactive ion etching apparatus, there is disclosed, in J.P. KOKAI No. 58-151028 or the corresponding U.S. Pat. No. 4,422,896 and J.P. KOKAI No. 59-140375 (or U.S. Pat. No. 4,581,118 corresponding thereto), a reactive ion etching apparatus having a built-in means for generating a magnetic field parallel to the surface of a material to be etched, the means being disposed on a negative electrode to which microwave power is applied and which serves as a support for the material to be etched.

On the other hand, J.P. KOKAI No. 58-170016 discloses a reactive ion etching apparatus which is equipped with a means for generating a magnetic field perpendicular to the surface of a negative electrode serving as a support for a material to be etched.

These reactive ion etching apparatuses make it possible to increase the concentration of reactive species present in the gas plasma generated therein. Therefore, the use of such apparatuses makes it possible to perform the etching procedure more rapidly compared with the use of a common parallel plate type reactive ion etching apparatus.

However, in such apparatuses, rapid etching can be achieved by increasing the electric voltage to be applied thereto, but on the other hand, problems such that a material to be etched is impaired during the etching process and that the materials cause deformation or property modification due to heat generated and/or applied thereto during the etching procedure arise.

Moreover, in the formation of resist patterns utilizing a bilayer resist or a trilayer resist and the aforementioned dry development technique in which desired resist patterns are formed by selectively diffusing, into the areas on which the desired resist patterns are formed, an organic silicone compound such as those disclosed in J.P. KOKAI No. 61-107346 to thus form an etch barrier having enhanced resistance to etching, it is impossible to select a sufficient selective etching ratio between the portions to be etched and those serving as the etching barrier and, therefore, a rapid etching process cannot be carried out when these reactive ion etching apparatuses are used as a dry developing apparatus in which oxygen plasma is generated and used. Moreover, a line width control of resist patterns becomes insufficient due to the difference between the etching rate of portions of the material to be etched in the vicinity of wafer chucks and that of the other portions thereof. In addition, since in the conventional means for supporting a wafer, the surface of the wafer is directly clamped, particles are formed on the surface of a wafer.

The present invention relates to an apparatus for etching, which is used in the manufacturing processes of semiconductor elements such as ICs and LSIs and more particularly to a reactive ion etching apparatus.

SUMMARY OF THE INVENTION

Accordingly, it is an object of the present invention to provide a reactive ion etching apparatus, which makes it possible to carry out a rapid etching and is excellent in etching selectivity, which does not impair materials to be etched during the etching process and does not cause deformation, property modification or the like due to heat generated and/or applied thereto during the process, in which the etching rate is equivalent throughout the surface of materials to be etched and a sufficient line width control of the wafer surface to be processed can be attained, and which does not cause the formation of particles on the surface of a wafer and can provide a high etching yield.

To achieve the foregoing object of the present invention, there is provided a reactive ion etching apparatus equipped with means for generating a magnetic field parallel to the surface of a material to be etched, the apparatus being characterized in that it comprises a negative electrode, means for supporting the material to be etched hereinafter referred to as "material" which is disposed on the negative electrode and means for cooling the negative electrode to a temperature of not more than 0° C.

According to the apparatus of the present invention, the reactive ion etching is carried out by placing a material on the supporting means disposed on the negative electrode, cooling the negative electrode to a temperature of not more than 0° C. and then generating reactive ion species therein.

According to the reactive ion etching apparatus of the present invention, the negative electrode which supports the material can be cooled to a temperature of not more than 0° C., further an electrostatic chucking device can be used and an inert gas can be charged into a space adjacent to the back face of the material. Therefore, it becomes possible to perform the etch procedure which can be rapidly carried out and is excellent in selectivity; and which does not impair the materials to be etched during the etching process and does not cause deformation, property modification of the material due to heat generated and/or applied thereto during the process. In particular, the electrostatic chucking device according to the present invention makes it possible to adhere the material to the support even during the absence of reactive ions. This is advantageous in view of the working processes. Finally, the reactive ion etching apparatus of the present invention is excellent in a line width control of resist patterns and makes it possible to perform the etching process without forming particles on wafer surface to be processed.

The reactive ion etching apparatus according to the present invention is particularly suitable for the use as an apparatus for dry-developable resists for dry developing processes.

The above and other objects, effects, features and advantages of the present invention will become more apparent from the following description of embodiments thereof taken in conjunction with the accompanying drawings.

DETAILED DESCRIPTION OF PREFERRED EMBODIMENTS

Embodiments of the reactive ion etching apparatus according to the present invention will hereunder be explained in more detail with reference to the accompanying drawings.

Figure 1:
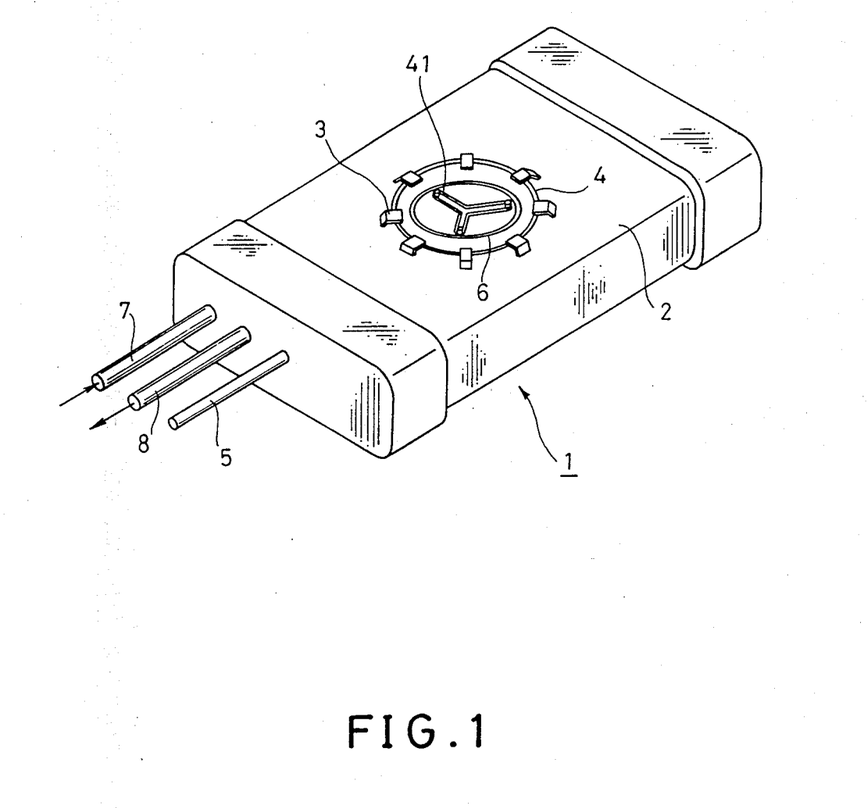
FIGS. 1 through 3 are a perspective view, a cross-sectional view and a plan view of an embodiment of a negative electrode used in the reactive ion etching apparatus according to the present invention, respectively.
Figure 2:
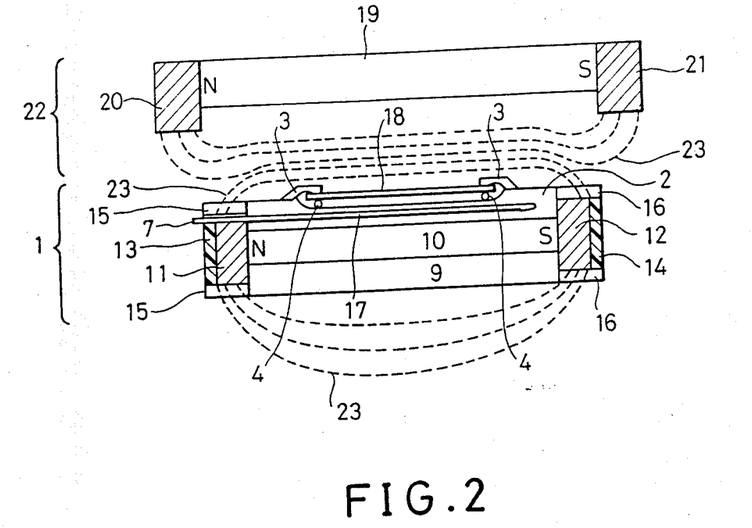
Figure 3:
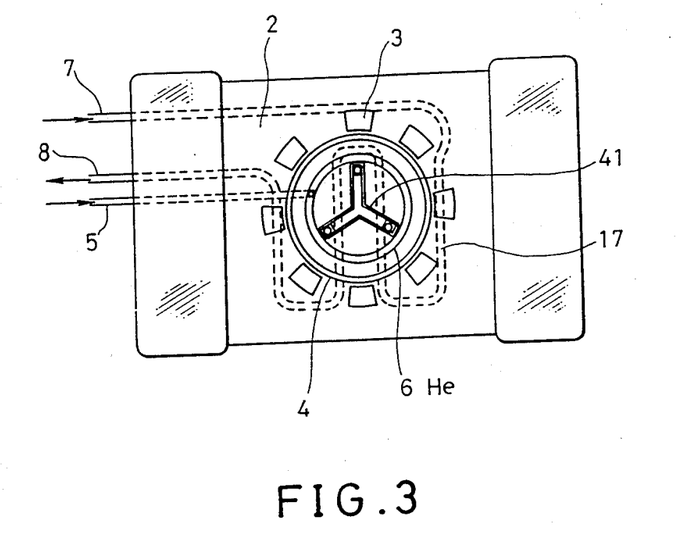

In FIGS. 1 through 3, the reference numeral 1 represents an entire negative electrode. A wafer chuck 3 composed of a non-magnetic substance is disposed on an upper plate 2 of the negative electrode 1 and the wafer chuck 3 holds and supports a material 18 (see FIG. 2) such as a silicon wafer. Reference numeral 41 represents a wafer-supporting member disposed on a lifter for moving the material 18 upward and downward directions. The material 18 is placed on the upper plate 2 of the negative electrode 1 through the wafer-supporting member 41 and an o-ring 4 and is fixed by the wafer chuck 3 in place. An inert gas such as helium gas introduced through an inlet 5 for the inert gas flows out from a gas outflowing groove 6 formed inside of the o-ring 4 and fills a space formed between the bottom surface of the material 18 and the upper plate 2 of the negative electrode 1 to thus dissipate heat generated or applied to the material during the etching process towards the negative electrode which is cooled. The negative electrode 1 is cooled to a temperature of not more than 0° C., preferably 0° to −40° C. and more preferably −20° to −40° C. with a cooling medium which is introduced through an inlet 7 therefor, passes through a passage 17 for a cooling medium formed within the upper plate 2 of the negative electrode 1 (see FIGS. 2 and 3) and is discharged through an outlet 8 therefor.

As will be seen from FIG. 2, a permanent magnet 10 is placed between the upper plate 2 and a lower plate 9 of the negative electrode 1 and pole pieces 11 and 12 made of magnetic substances are disposed on both sides of the three-layered structure thereof, respectively. Grounded shield 15 and 16 are connected to corresponding insulators 13 and 14 which are adhered to the pole pieces 11 and 12 respectively. The upper plate 2 of the negative electrode 1 is provided with the passage 17 for a cooling medium within the same for introducing, through the inlet 7 for a cooling medium, a cooling medium such as liquid nitrogen and fluorine type cooling mediums (e.g., Fluorinate available from 3M Co., Ltd.) to cool the material 18 to be etched.

As shown in FIG. 2, an auxiliary magnet 22 for generating an auxiliary magnetic field, which is composed of a permanent magnet 19 and pole pieces 20 and 21 and which is disposed above the body of the negative electrode 1. Thus the magnetic field parallel to the surface of the material 18 is generated due to the interaction between the permanent magnet 10 within the body of the negative electrode 1 and the auxiliary magnet 22, as depicted by lines of magnetic force 23.

Then, another embodiment of the negative electrode used in the reactive ion etching apparatus according to the present invention will be explained in detail with reference to FIGS. 4 and 5.

Figure 4:
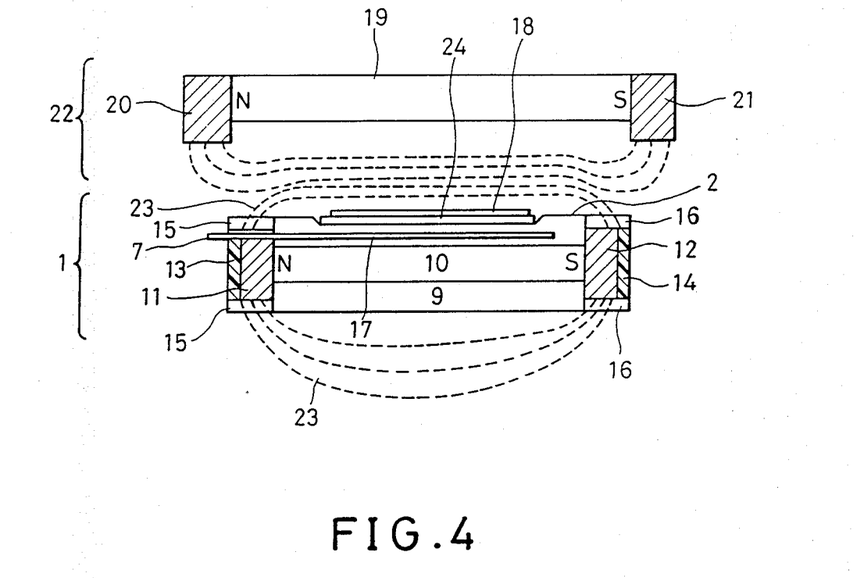
FIGS. 4 and 5 are a cross-sectional view and a plan view of another embodiment of a negative electrode used in the reactive ion etching apparatus of the present invention, respectively.
Figure 5:
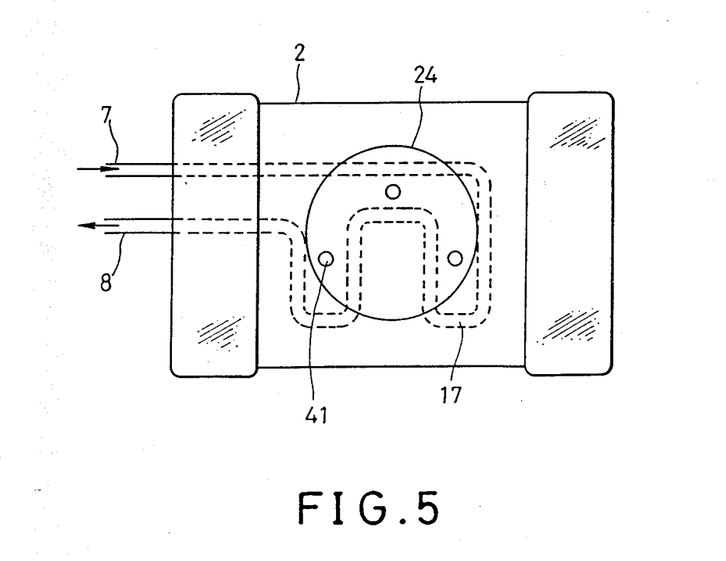

In FIGS. 4 and 5, reference numeral 24 represents an electrostatic chucking device for supporting the material 18. The electrostatic chucking device 24 comprises an electrode sandwiched between a ferroelectric substance such as those composed of a polymeric material (for instance, a polyimide and polyvinylidene fluoride) or a ceramic material, for instance, alumina and the material 18 is supported on the upper plate 2 of the negative electrode 1 due to the action of electric charges generated by the electrostatic chucking device 24. In the present embodiment, remaining parts are the same as those explained above in connection with the embodiment shown in FIGS. 1 through 3 and, therefore, the explanation thereof is omitted herein. The auxiliary magnet 22 is also provided in this embodiment.

A still another embodiment of the negative electrode used in the reactive ion etching apparatus of the present invention will be explained in detail below referring to the attached FIGS. 6 through 9.

In this embodiment, an electrostatic chucking device 124 is disposed on a negative electrode 101 as in the foregoing embodiment.

Figure 6:
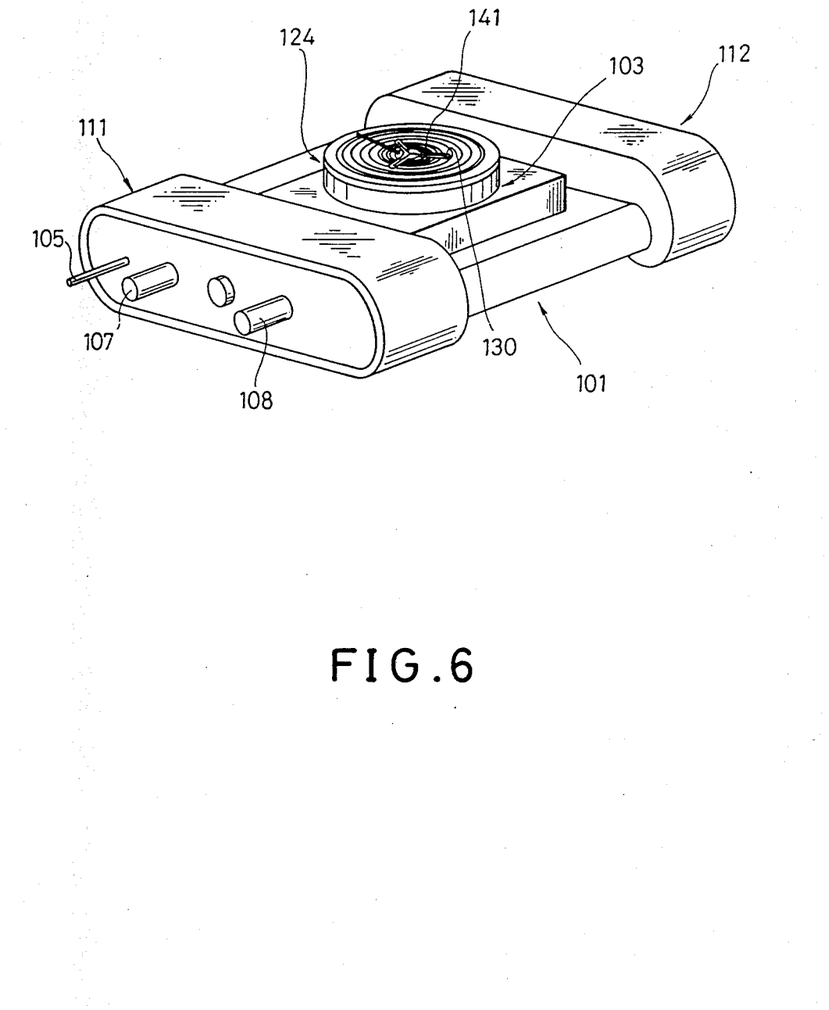
FIGS. 6 through 9 are a perspective view, a plan view, a perspective plan diagram and a cross-sectional view of still another embodiment of a negative electrode used in the reactive ion etching apparatus according to the present invention, respectively.

In FIG. 6, the negative electrode 101 is made by a block of copper from which a cover is removed and a block 103 of aluminum (hereinafter referred to as "Al block" for simplicity) is disposed on the upper surface of the negative electrode block 101. Moreover, the electrostatic chucking device 124 is placed on the upper surface of the Al block 103.

Figure 8:
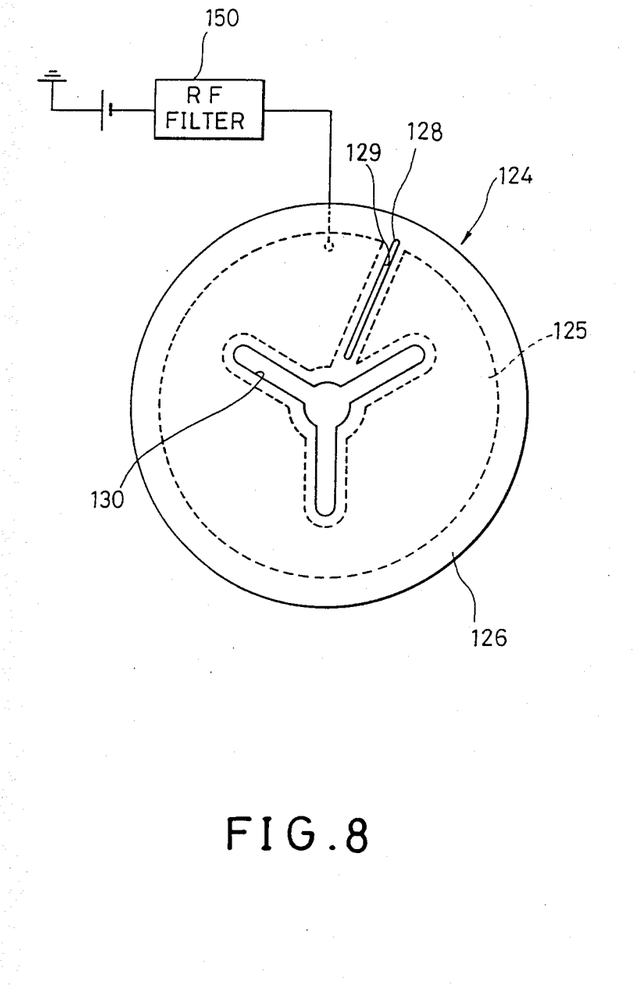

The electrostatic chucking device 124 comprises a piece of plate-like electrode 125 as shown in FIG. 8, which is embedded in a ferroelectric substance 126 such as those composed of a polymeric material, for instance, polyimide and polyvinylidene fluoride; or a ceramic material, for instance, alumina.

Figure 7:
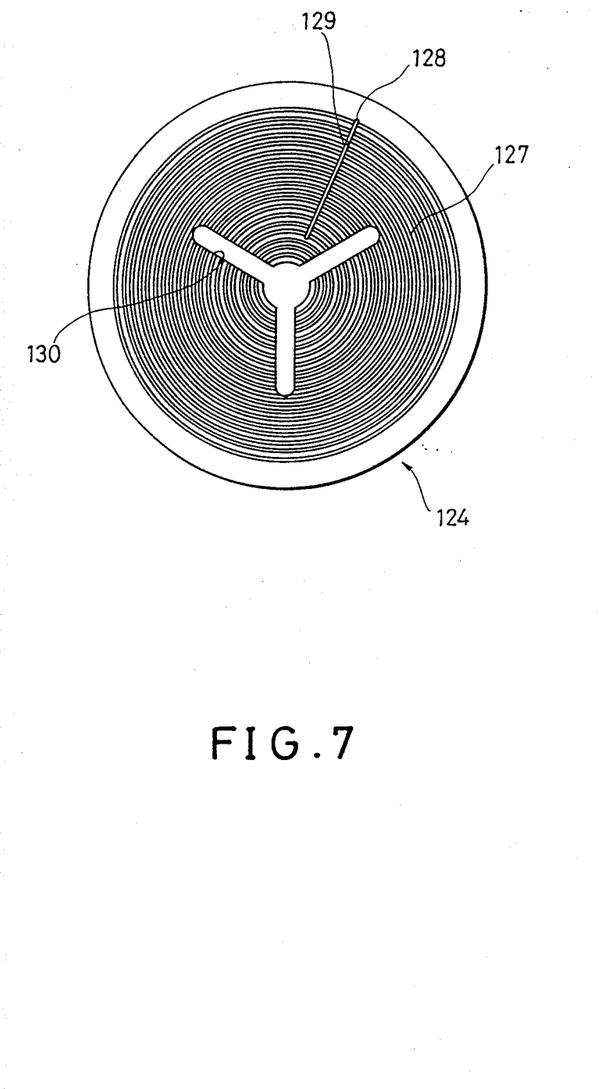

As shown in FIG. 7, a plurality of concentric grooves 127 for introducing an inert gas are formed on the surface of the electrostatic chucking device 124 in such a way that the grooves are communicated to one another through radially extending grooves 128. A through hole 129 which is formed through the electrostatic chucking device 124 opens toward the radial grooves 128.

The depth of the concentric grooves 127 in general ranges from 5 μm to 1 mm, preferably 5 μm to 100 μm and the area of the concentric grooves 127 on the surface of the electrostatic chucking device 124 usually ranges from 10 to 90%, preferably 30 to 80% of the wafer chuck area.

The shape of the grooves 127 is not restricted to specific ones in the present invention so far as the shape makes it possible to fill the space formed between the material and the electrostatic chucking device 124 with an inert gas. Examples of such shapes of the grooves are a spiral- or grid-like ones.

Moreover, the electrostatic chucking device 124 is provided with an opening 130 extending towards three directions arranged at equal angles and a wafer-supporting member 141 of a lifter 140 (see FIG. 9) for mounting and demounting the material is allocated at the opening 130.

Figure 9:
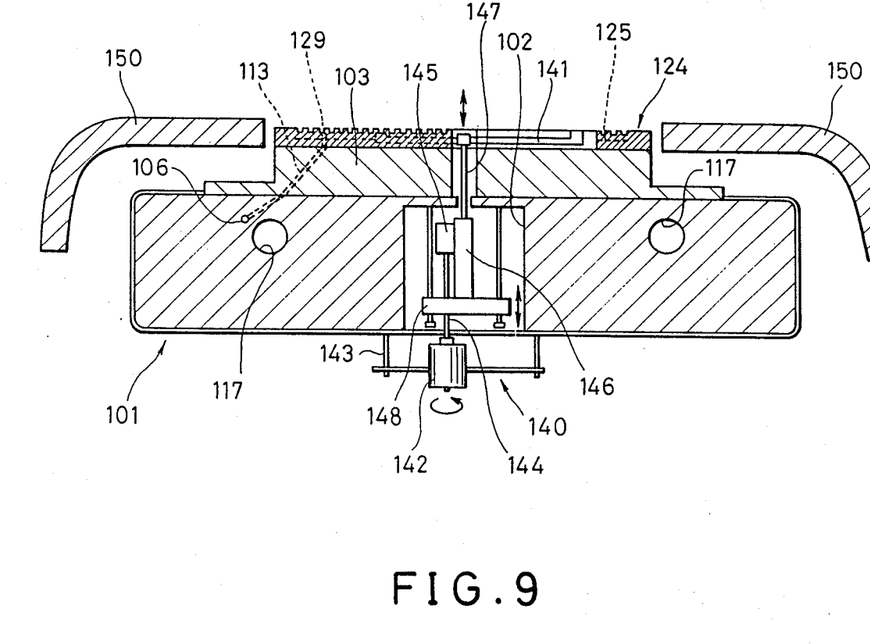

FIG. 9 is a cross-sectional view of the negative electrode shown in FIG. 6. In this embodiment, a driving mechanism is contained in a cavity 102 formed in the negative electrode block 101 which is equipped with a passage for a cooling gas and a permanent magnet. A motor 142 for driving the lifter is mounted on and fixed to the negative electrode block 101 by means of a bracket 143 and a gear 145 is fixed to the end portion of a driving shaft of the motor 142. The gear 145 is engaged with a gear 146 and the gear 146 is connected to a connecting rod 147 at one end thereof which is, in turn, connected to the wafer-supporting member 141 and to a guide block 148 at the other end thereof. The guide block 148 is slidably supported with a guide bar 149 which is perpendicularly disposed on the negative electrode block 101.

The negative electrode block 101 is provided with a permanent magnet which is equipped with pole pieces 111 and 112 composed of magnetic substances on both ends thereof respectively (see FIG. 6) as in the preceding embodiment. As in the preceding embodiment shown in FIG. 3, a passage 117 for a cooling medium and a passage 106 for an inert gas are formed within the negative electrode block 101 and the pole piece 111. The passage 117 for a cooling gas is communicated with an inlet 107 for a cooling medium and an outlet 108 therefor. On the other hand, the passage 106 for an inert gas is communicated with an inlet 105 for introducing the same and further to a passage 113 for inert gas formed within an Al block 103.

In this respect, the passage 113 for an inert gas is communicated with the through hole 129 of the electrostatic chucking device 124.

Figure 10:
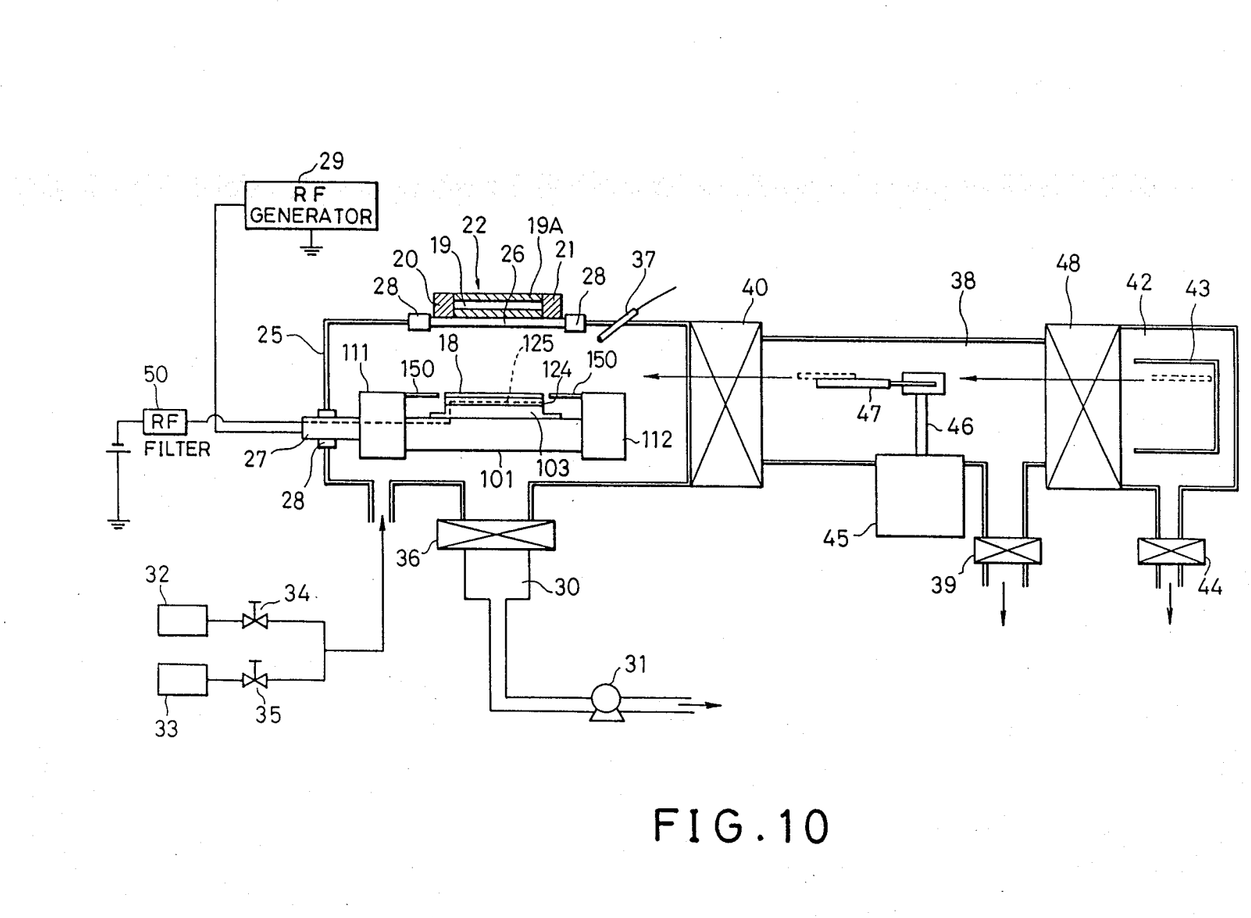
FIG. 10 is a diagram schematically illustrating the construction of an embodiment of the entire reactive ion etching apparatus according to the present invention.

FIG. 10 is a diagram partly in section, schematically illustrating the construction of an embodiment of the entire reactive ion etching apparatus according to the present invention.

The negative electrode 1 or 101 as shown in FIG. 1, 4 or 6 may be placed within a reaction vessel 25, but in FIG. 10, an embodiment in which the negative electrode block 101 provided with the electrostatic chucking device 124 shown in FIG. 6 is placed in the reaction vessel 25 is illustrated. The material 18 is supported and fixed in place by the electrostatic chucking device 124. A negative voltage is applied to an electrode 125 of the electrostatic chucking device 124 through a radio frequency (RF) filter 50. A positive electrode 26 is disposed so as to face the negative electrode 101 and it is insulated from the reaction vessel 25 through an insulator 28. In addition, the auxiliary magnet 22 explained above is disposed on the back surface of the positive electrode 26 and in this embodiment, a permanent magnet 19 is contained in a magnet-supporting block 19A.

A terminal block 27 connected to the negative electrode 101 is insulated from the reaction vessel 25 through an insulator 28 mounted on the reaction vessel 25. As will hereunder be explained in more detail, gas plasma derived from a reactive gas introduced into the reaction vessel 25 is generated by applying an RF power from an RF power source 29 between the positive electrode 26 and the negative electrode 101 and the reactive species present in the gas plasma generated contribute to etching of the material.

In this embodiment, a turbo-pump 30 and a mechanical pump 31 are operated to evacuate the reaction vessel 25 up to a high vacuum and then a reactive gas such as oxygen gas from a reactive gas container 32 or the same with an inert gas from an inert gas container 33 are introduced into the reaction vessel 25 through valves 34 and 35 for controlling the flow rate thereof respectively. Thereafter, a plasma gas of the reactive gas is generated by applying an RF power from the RF power source 29 to the negative electrode 101 to perform etching of the material 18.

In these etching operations, the flow rate of the reactive gas and the pressure in the reaction vessel 25 are controlled by the valves 34 and 35 for controlling the flow rate as well as a control valve 36. The progress of the etching of the material 18 can be detected with a device 37 for detecting the degree of etching.

According to the apparatus of this embodiment, if the materials are, for instance, wafers, it is possible to successively process a plurality of such wafers by taking out the wafer from an wafer cassette 43 containing a plurality of wafers one by one to place it in a load-lock chamber 38 and thus processing the materials in order. In other words, the cassette 43 containing a plurality of the materials 18 is introduced into a cassette chamber 42, the chamber 42 is evacuated by opening a gate valve 44 and a gate valve 48 is opened at an instance when the pressure of the chamber 42 reaches the same level as that in the load-lock chamber 38. Each material 18 can be introduced into the load-lock chamber 38 by operating an arm member 47 capable of up-down motion expansion and contraction which is mounted on a rotary shaft 46 of a conveying device 45. Then the gate valve 48 is closed and simultaneously a gate valve 39 is opened as well as the load-lock chamber 38 is evacuated by operating a mechanical pump (not shown). Thereafter, the gate valve 40 is opened and then the material to be etched is automatically mounted on the electrostatic chucking device 124 within the reaction vessel 25 by expanding the arm member 47.

Moreover, it is preferred that a means for purging with hot nitrogen gas or that for heating the material processed with a heater is disposed in the load-lock chamber 38 for the purpose of preventing the humidity in air from causing condensation on the material 18 which is cooled after the etching procedure, when the pressure in the chamber is released to atmospheric pressure.

Conditions for etching the material to be etched utilizing the reactive ion etching apparatus as shown in FIG. 10 are in general as follows:

(i) the distance between the negative electrode 101 and the positive electrode 26: 3 to 20 cm;

(ii) electric power applied between the negative electrode 101 and the positive electrode 26: 10 W to 4 kW, preferably 100 W to 3 kW;

(iii) the temperature of the negative electrode 101: not more than 0° C., preferably 0° to −40° C. and more preferably −20° to −40° C.

(iv) the temperature of the material to be etched: not more than 40° C.;

(v) the strength of the magnetic field in the vicinity of the material: 100 to 400 gauss;

(vi) the flow rate of the reactive gas: 2 to 200 SCCM, preferably 2 to 100 SCCM;

(vii) the pressure in the reaction vessel during the etching operation: 1 to 100 mTorr, preferably 5 to 80 mTorr;

(viii) the method for introducing the reactive gas into the reaction vessel: in the embodiment shown in FIG. 10, the gas is introduced from the lower side of the reaction vessel 25, but it is also possible to form a hole or holes on a side of the reaction vessel 25 or on the positive electrode 26, through which the gas is introduced;

(ix) examples of such reactive gases: oxygen gas ($O_2$), nitrous oxide ($N_2O$), carbon tetrafluoride ($CF_4$), perfluoroethane ($C_2F_6$), perfluoropropane ($C_3F_8$) and the like;

(x) examples of inert gases: nitrogen gas ($N_2$), helium gas (He), argon gas (Ar) and the like;

(xi) the pressure of the inert gas present in the space between the material and the electrostatic chucking device: 1 to 50 Torr, preferably 5 to 20 Torr.

According to the reactive ion etching apparatus of the present invention, the etching anisotropy with respect to the material can further be enhanced by covering the inner surface of the reaction vessel 25 with a plate, sheet or film of a heat resistant material containing not less than 30% by weight, preferably not less than 50% by weight of carbon, such as a polymer obtained by plasma polymerization of, for instance, carbon tetrafluoride ($CF_4$), methanol ($CH_3OH$), ethanol ($C_2H_5OH$), graphite, diamond, such a synthetic polymer as polyimide, poly-p-phenylene and polyacetylene, or composite materials thereof. In such a case, these sheets, plates or films are preferably fixed removably. Moreover, if the surface of the upper plate 2 of the negative electrode or the negative electrode block 101 corresponding to the peripheral portion of the material is covered with a cover 150 comprised of a material containing not less than 30% by weight of carbon (see FIGS. 9 and 10), it is possible to make the etched surface of the material 18 more uniform.

Examples of the materials 18 which can be etched by the reactive ion etching apparatus of the present invention include those composed of a substrate such as a glass plate, a silicon wafer or a GaAs substrate provided thereon with a resist layer.

The resist layer may be obtained from the following materials:

(1) Materials obtained by selectively silylating, with a silane compound such as hexamethyl disilazane or silyl chloride, a product which is prepared by partially esterifying a hydroxyl group-containing resin such as a novolak resin or hydroxystyrene resin with a quinonediazide sulfonyl halide to form a radiation-sensitive resin and then irradiating it with radiation rays;

(2) Materials obtained by irradiating a trilayer film with radiation rays, the upper layer thereof being composed of, for instance, such a resist material as quinonediazide type positive-working resists, cyclized rubber type negative-working resists or bisazide-novolak resin type negative-working resists; such an ionizing radiation-sensitive positive-working resist material as polymethyl methacrylate, polymethyl isopropenyl ketone, polybutene sulfone or poly-2-methyl-1-pentenesulfone-novolak resin; or such an ionizing radiation-sensitive negative-working resist material as chlorinated polymethylstyrene, chloromethyleted polystyrene or silicone ladder polymers; the intermediate layer thereof (a layer for etching barrier) being composed of an inorganic film such as a silicon dioxide ($SiO_2$) film or titanium/tungsten (Ti/W) film; and the lower layer thereof being composed of such a highly heat resistant polycondensed polymer as polyimide and polyamide-imide resins, such a (meth)acrylic polymer as polymethyl methacrylate and polyphenyl acrylate, quinonediazide type positive-working resists, or bisazidenovolak resin type negative-working resists;

(3) Materials obtained by irradiating a bilayer film with radiation rays, the upper layer thereof being composed of a resist material such as those composed of a quinonediazide type light-sensitive material or a bisazide type light-sensitive material and a silicon-containing polymer; an ionizing radiation-sensitive negative-working resist material such as a silicon-containing polymer having haloalkyl group(s); or an inorganic material such as chalcogenide glass; and the lower layer being composed of the same lower layer as that of the trilayer film described in connection with the foregoing item (2).

Etching examples utilizing the reactive ion etching apparatus according to the present invention will hereinafter be discussed in more specifically.

EXAMPLE 1

(1) There was applied, to the surface of a silicon wafer having a diameter of 6 inches, a resist composed of a partially esterified product of 6-diazo-5, 6-dihydro-5-oxo-1-naphthalene sulfonic acid chloride and a novolak resin by using a spin coater; and the layer was irradiated with ultraviolet light through a reticle utilizing a g-line wafer-stepper with a 0.42 numerical aperture (NA). Then the silicon wafer was placed in a silylation device provided with an upper heating plate of stainless steel having a plurality of fine pores of 50 μm in diameter and a lower heating plate of stainless steel, hexamethyl disilazane was introduced into the silylation device and then the silylation device was closed to perform silylation of the exposed portions of the resist layer under the following conditions: the total pressure of 760 mmHg, the hexamethyl disilazane concentration of 6.6% by volume, at a temperature of 140° C. for one minute.

(2) The wafer provided thereon with the silylated resist layer obtained in procedures (1) was etched in the same reactive ion etching apparatus as shown in FIG. 10 except that the negative electrode 1 shown in FIG. 1 was used as a negative electrode.

The etching process was performed under the following conditions: the distance between the negative electrode 1 and the positive electrode 26 being 7 cm; the electric power applied between the negative electrode 1 and the positive electrode 26 being 2 kW; the temperature of the u negative electrode 1 being −25° C.; that of the wafer provided with the silylated resist layer being not more than 30° C.; the strength of the magnetic field in the vicinity of the material being 170 gauss; the reactive gas used being an oxygen gas which was introduced into the apparatus through hole-formed on the positive electrode 26 at a flow rate of 30 SCCM. In addition, the pressure in the apparatus during the etching procedure was 3 mTorr.

In this respect, the term "temperature of the negative electrode" herein means the temperature within the negative electrode.

The resist pattern on the wafer obtained according to dry development technique based on etching is a line-and-space pattern at equal intervals (0.5 μm; resolution). The apparatus makes it possible to perform etching procedures at a high selective etching ratio: a ratio of an etch rate of the unirradiated and unsilylated portions of the resist over that of the irradiated and silylated portions was no less than 10 and the line width deviation (3 SIGMA) across the wafer was 6.7% at 1.0 μm geometry.

EXAMPLES 2 THROUGH 4 AND COMPARATIVE EXAMPLES 1 AND 2

Wafers provided thereon with the same silylated resist layer as in Example 1 were subjected to dry development utilizing the same reactive ion etching apparatus as used in Example 1 under various etching conditions listed in the following Table I. In this connection, conditions other than those listed in the following Table I were the same as those in Example 1.

TABLE I

| | (1) Etching Conditions | | | | |
|---|---|---|---|---|---|
| Ex. No. | Applied power (kW) | Pressure (mTorr) | Flow rate of reactive gas (SCCM) | T(°C.) of neg. electrode | T' (°C.) of wafer |
| 2 | 2 | 3 | 30 | 0 | <30 |
| 3 | 2 | 3 | 30 | −40 | <30 |
| 4 | 3 | 5 | 80 | −25 | <30 |
| 1(*) | 2 | 3 | 30 | 15 | <30 |
| 2(*) | 3 | 5 | 80 | 15 | <30 |

| | (2) Estimated Results | | |
|---|---|---|---|
| Ex. No. | Resolution | Selective Ratio | Scattering in Line Width |
| 2 | 0.5 | >10 | 7.2% |
| 3 | 0.5 | >10 | 6.1% |
| 4 | 0.5 | >10 | 8.7% |
| 1(*) | 0.7 | 5 | 13.4% |
| 2(*) | ashing of the whole surface | | |

(*): Comparative Example.

EXAMPLE 5

Wafers provided thereon with a resist layer silylated in the same manner as in Example 1 were etched in the same reactive ion etching apparatus as shown in FIG. 10 except that it was provided with a negative electrode block 101 equipped with an electrostatic chucking device 124 as shown in FIG. 6.

The etching process was performed under the following conditions: the distance between the negative electrode block 101 and the positive electrode 26 being 7 cm; the electric power applied between the negative electrode block 101 and the positive electrode 26 being 2 kW; the voltage applied to the electrode 125 of the electrostatic chucking device 124 being 2.0 kV; the temperature of the negative electrode being −25° C.; that of the wafer provided with the silylated resist layer being not more than 30° C.; the strength of the magnetic field in the vicinity of the material to be etched being 170 gauss; the reactive gas used being oxygen gas which was introduced into the apparatus through a hole formed on the lower side of the reaction vessel 25 at a flow rate of 30 SCCM. In addition, the pressure in the apparatus during the etching procedure was 3 mTorr.

Moreover, the back surface of the wafer, in other words the concentric grooves 127 of the electrostatic chucking device 124 was filled with helium gas at a pressure of 10 Torr.

The resolution of the resist pattern on the wafer obtained according to dry development based on etching was 0.5 μm and the scattering in the line width was not more than 3%. The resist layer could be etched at a high selective etching ratio in the order of not less than 10.

EXAMPLES 6 THROUGH 8 AND COMPARATIVE EXAMPLES 3 THROUGH 6

Wafers provided thereon with the same silylated resist layer as in Example 5 were subjected to dry development utilizing the same reactive ion etching apparatus as used in Example 5 under various etching conditions listed in the following Table II. In this connection, conditions other than those listed in Table II were the same as those in Example 5.

TABLE II

| | (1) Etching conditions | | | | | |
|---|---|---|---|---|---|---|
| Ex. No. | Applied power (kW) | Pressure (mTorr) | Flow rate of reactive gas (SCCM) | He gas (Toff) | T (°C.) of neg. electrode | T' (°C.) of wafer |
| 6 | 2 | 3 | 30 | 10 | 0 | <30 |
| 7 | 2 | 3 | 30 | 10 | −40 | <30 |
| 8 | 3 | 5 | 80 | 10 | −25 | <30 |
| 3(*) | 2 | 3 | 30 | 10 | 15 | <30 |
| 4(*) | 3 | 5 | 80 | 10 | 15 | <30 |
| 5(*) | 2 | 3 | 30 | not introduced | −40 | <30 |
| 6(*) | 3 | 5 | 80 | not introduced | −25 | <30 |

| | (2) Estimated Results | | |
|---|---|---|---|
| Ex. No. | Resolution | Selective Ratio | Scattering in Line Width |
| 6 | 0.5 | >10 | 4.2% |
| 7 | 0.5 | >10 | <3.0% |
| 8 | 0.5 | >10 | 3.5% |
| 3(*) | 0.7 | 5 | 8.0% |
| 4(*) | ashing of the whole surface | | |
| 5(*) | 0.5 | 6 | 7.2% |
| 6(*) | 0.6 | 5 | 7.8% |

(*): Comparative Example.

The present invention has been described in detail with respect to preferred embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

What is claimed is:

1. A reactive ion etching apparatus comprising means for generating magnetic field parallel to the surface of a material to be etched; a negative electrode; supporting means mounted on said negative electrode for supporting the material to be etched; and means for cooling said negative electrode to a temperature of not more than 0° C.

2. A reactive ion etching apparatus according to claim 1 wherein said negative electrode is cooled to a temperature ranging from 0° to −40° C. by said cooling means.

3. A reactive ion etching apparatus according to claim 1 wherein said negative electrode is cooled to a temperature ranging form −20° to −40° C. by said cooling means.

4. A reactive ion etching apparatus according to claim 1 wherein said supporting means is an electrostatic chucking device.

5. A reactive ion etching apparatus according to claim 4 wherein said electrostatic chucking device comprises a piece of plate-like electrode and a ferroelectric substance in which said plate-like electrode is embedded.

6. A reactive ion etching apparatus according to claim 5 wherein said ferroelectric substance is provided thereon with a plurality of grooves and the apparatus further comprises means for introducing an inert gas into said plurality of grooves.

7. A reactive ion etching apparatus according to claim 6 wherein said inert gas is helium gas.

8. A reactive ion etching apparatus according to claim 6 wherein the depth of said plurality of grooves ranges from 5 $\mu$m to 1 mm and the total area of the grooves ranges from 10 to 90% of the chucked area of the material to be etched when the material is chucked with said electrostatic chucking device.

9. A reactive ion etching apparatus according to claim 1 wherein said means for generating magnetic field parallel to the surface of the material to be etched comprises a permanent magnet disposed in said negative electrode and an auxiliary magnet disposed above said negative electrode through a space.

10. A reactive ion etching apparatus according to claim 1 wherein said material to be etched is cooled to a temperature not more than 40° C.

* * * * *